United States Patent
Inoi et al.

(10) Patent No.: US 6,333,589 B1
(45) Date of Patent: Dec. 25, 2001

(54) LAMINATED PIEZOELECTRIC TRANSFORMER AND METHOD FOR MANUFACTURING THE SAME

(75) Inventors: Takayuki Inoi; Susumu Saito, both of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/289,384

(22) Filed: Apr. 12, 1999

(30) Foreign Application Priority Data

Apr. 10, 1998 (JP) .................................... 10-116083

(51) Int. Cl.⁷ .................................................. H01L 41/08
(52) U.S. Cl. ..................... 310/358; 310/351; 310/359; 310/366
(58) Field of Search ..................... 310/358, 359, 310/351–353, 366, 348

(56) References Cited

U.S. PATENT DOCUMENTS

| | | | |
|---|---|---|---|
| 3,612,922 | * 10/1971 | Furnival | 310/351 |
| 3,660,699 | * 5/1972 | Sakurai et al. | 310/348 X |
| 3,662,194 | * 5/1972 | Moriki et al. | 310/352 X |
| 3,836,794 | * 9/1974 | Shimizu et al. | 310/359 X |
| 3,909,641 | * 9/1975 | Ohshima et al. | 310/352 X |
| 4,742,264 | * 5/1988 | Ogawa | 310/359 X |
| 5,241,236 | * 8/1993 | Sasaki et al. | 310/358 |
| 5,747,916 | 5/1998 | Sugimoto et al. | 310/348 |
| 5,828,160 | * 10/1998 | Sugishita | 310/359 X |
| 5,861,704 | * 1/1999 | Kitani et al. | 310/359 |
| 5,892,318 | * 4/1999 | Dai et al. | 310/358 |

FOREIGN PATENT DOCUMENTS

| | | | |
|---|---|---|---|
| 564803 | * 1/1972 | (CH) | 310/352 |
| 0173484 | * 7/1991 | (JP) | 310/359 |
| 404-167504 | * 6/1992 | (JP) | 310/359 |
| 5-21858 | * 1/1993 | (JP) | 310/359 |
| 5-235432 | 9/1993 | (JP) . | |
| 6-82870 | 11/1994 | (JP) . | |
| 8-274382 | 10/1996 | (JP) . | |
| 8-298213 | 11/1996 | (JP) . | |
| 9-275231 | 10/1997 | (JP) . | |
| 10-41560 | 2/1998 | (JP) . | |

* cited by examiner

*Primary Examiner*—Mark Budd
(74) *Attorney, Agent, or Firm*—Sughrue, Mion, PLLC

(57) ABSTRACT

A laminated piezoelectric transformer has one through-hole formed in the laminated piezoelectric transformer at a center position which becomes a node of vibration of the laminated piezoelectric transformer, and a support rod member is inserted in the through-hole and bonded to the through-hole by a bonding agent, for supporting the laminated piezoelectric transformer.

8 Claims, 7 Drawing Sheets

LAMINATED PIEZOELECTRIC TRANSFORMER AND METHOD FOR MANUFACTURING THE SAME

BACKGROUND OF THE INVENTION

1. Field of the Invention

The present invention relates to a piezoelectric transformer and a method for manufacturing the same, and more specifically to a laminated piezoelectric transformer advantageously incorporated in a small-sized rectifying power supply which is required to have a small size, a light weight and high reliability, and a method for manufacturing the same.

2. Description of Related Art

In the prior art, a solenoid type electromagnetic transformer was used as a step-down transformer in a so-called AC adapter for supplying an electric power to various battery-cell-driven electronic instruments from a power-frequency voltage distribution system. The electromagnetic transformer is composed of a magnetic core and a conducting wire wound around the magnetic core by a large number of turns. Because of this construction, it is actually difficult to realize a small-size, light-weight electromagnetic transformer.

On the other hand, a piezoelectric transformer utilizing a piezoelectric effect, which is completely different from the electromagnetic transformer in operation principle, has been provided.

The piezoelectric transformer is discussed in for example C. A. Rosen, "Ceramic Transformer", Proc. of Electronic Component Symposium, 1957. In this connection, various mounting or packaging methods for the piezoelectric transformer have been proposed in the prior art (See for example, Japanese Patent Application Pre-examination Publication Nos. JP-A-08-274382 (an English abstract is available from the Japanese Patent Office and the content of the English abstract is incorporated by reference in its entirety into this application) and JP-A-08-298213 (which corresponds to U.S. Pat. No. 5,747,916, the content of which is incorporated by reference in its entirety into this application).

Now, an example of the Rosen type piezoelectric transformer which is a typical prior art piezoelectric transformer, will be described with reference to FIG. 1A which is a diagrammatic perspective view illustrating the prior art Rosen type piezoelectric transformer mounted on a support member, and which corresponds to FIG. 13 of JP-A-08-274382, and also with reference to FIG. 1B which is a diagrammatic sectional view taken along the line A—A in FIG. 1A but showing a condition that the piezoelectric transformer is supported within a housing.

Referring to FIGS. 1A and 1B, the shown prior art Rosen type piezoelectric transformer includes a piezoelectric ceramic plate 510 in the form of an elongated plate, which is divided into a driver section 51 and a generator section 52. The driver section 51 is polarized in a thickness direction of the piezoelectric ceramic plate 510, and therefore includes a pair of planar electrodes 511 and 512 formed on upper and lower surfaces of the piezoelectric ceramic plate 510, respectively, so as to substantially cover the whole of the upper and lower surfaces in the driver section 51. On the other hand, the generator section 52 is polarized in a lengthwise direction of the piezoelectric ceramic plate 510, and an end electrode 515 is formed on the generator section side end surface of a pair of end surfaces in the lengthwise direction. Furthermore, support members 520 are provided each to surround the piezoelectric ceramic plate 510 along a direction orthogonal to the lengthwise direction of the piezoelectric ceramic plate 510.

The piezoelectric transformer having the above mentioned construction is used for a voltage step-up. Now, an operation principle of the piezoelectric transformer will be described.

If an AC voltage is applied from an external between the upper and lower planar electrodes 511 and 512 of the driver section 51, namely, between a pair of input terminals 517 and 518 connected to the planar electrodes 511 and 512, respectively, the driver section 51 is caused to vibrate in the lengthwise direction because of a piezoelectric lateral effect, in accordance with the magnitude of the applied AC voltage.

As a result, lengthwise direction vibration occurs in the piezoelectric ceramic plate 510, so that because of a piezoelectric longitudinal effect of the vibration, a stepped-up voltage having the same frequency as that of the input voltage is generated between the planar electrode 511 or 512 of the driver section 51 and the end electrode 515 of the generator section 52 (in the example shown in FIG. 1A, between the planar electrode 512 and the end electrode 515).

Next, a packaging of the above mentioned Rosen type piezoelectric transformer will be described. Referring to FIG. 1B, in order to support the piezoelectric transformer vibrating in the lengthwise direction because of the piezoelectric lateral effect, it is important to support the piezoelectric transformer without attenuating the vibration. In ordinary cases, the support member 520 is positioned in a region which becomes a node of the vibration called a "$\lambda$ mode".

In this prior art example, the support member 520 is formed of an elastic material such as rubber. Namely, two elastic members 520 formed of rubber are mounted to surround the piezoelectric ceramic plate 510 at vibration node positions, and an outer surface of the elastic members 520 is fixed to an inner surface of a housing 521 which accommodates therein the piezoelectric ceramic plate 510. Thus, the piezoelectric ceramic plate 510 is packaged.

Now, another structure of the package of the Rosen type piezoelectric transformer will be described with reference to FIG. 2A which is a diagrammatic perspective view illustrating another example of the Rosen type piezoelectric transformer mounted on a support member, and which substantially corresponds to those disclosed in JP-A-09-298213 and U.S. Pat. No. 5,747,916, and also with reference to FIG. 2B which is a diagrammatic sectional view taken along the line B—B in FIG. 2A but showing a condition that the piezoelectric transformer is supported within a housing. In FIGS. 2A and 2B, elements corresponding in function to those shown in FIGS. 1A and 1B are given the same reference numerals, and explanation will be omitted for simplification of description.

As will be seen from comparison between FIGS. 1A and 1B and FIGS. 2A and 2B, the piezoelectric transformer shown in FIGS. 2A and 2B is substantially the same as that shown in FIGS. 1A and 1B in construction and in operation principle, excluding that the support member 520 is constituted of a spring in place of the rubber.

Next, a heat-dissipating technology, which is important in a high-power piezoelectric transformer, will be described with reference to Japanese Utility Model Application Pre-examination Publication No. JP-U-06-82870. FIG. 3 is a diagrammatic perspective view illustrating the Rosen type piezoelectric transformer, disclosed in JP-U-06-82870, having a heat-dissipating plate mounted thereon for dissipating heat generated in the piezoelectric transformer.

The piezoelectric transformer shown in FIG. 3 is substantially the same as the piezoelectric transformers mentioned above in fundamental construction and in operation principle. Therefore, in FIGS. 3, elements corresponding in function to those shown in FIGS. 1A and 1B are given the same reference numerals, and explanation will be omitted for simplification of description.

The piezoelectric transformer shown in FIG. 3 is different from the piezoelectric transformers mentioned above in that, in order to dissipate heat generated in the piezoelectric transformer, the piezoelectric transformer shown in FIG. 3 has a heat-dissipating thin plate 806 which is formed of an aluminum thin plate and which is bonded by an epoxy resin bonding agent to a node where a heat generation becomes maximum.

In the above, the package structures of the Rosen type piezoelectric transformer have been described. In addition, a piezoelectric transformer having an operation principle different from that of the Rosen type piezoelectric transformer, has been proposed by for example Japanese Patent Application Pre-examination Publication No. JP-A-09-275231 (an English abstract is available and the content of the English abstract is incorporated by reference in its entirety into this application).

The piezoelectric transformer disclosed in JP-A-09-275231 is constituted by alternately stacking a plurality of piezoelectric ceramic layers and a plurality of internal electrode layers, and is so driven that the piezoelectric ceramic layers polarized in a thickness direction of the layers vibrate in a layer direction.

This laminated piezoelectric transformer has a high energy conversion efficiency, and by suitably selecting the number of stacked layers, it is possible to easily adjust the impedance.

In the prior art laminated piezoelectric transformer, however, a problem is encountered that it is difficult to package the piezoelectric body in an external housing without disturbing the vibration of the piezoelectric transformer.

Namely, it is desired to firmly couple the mechanically vibrating piezoelectric body to the external housing, but on the other hand, in order to effectively transmit the vibration of the driver section to the generator section, it is preferable that the piezoelectric body vibrates as freely as possible.

Therefore, a proposal to minimize attenuation of the mechanical vibration, has been made in which the support member constituting a connection point between the piezoelectric body and the housing, is mounted on a region of the node appearing in the vibration of the piezoelectric body. In addition, the support member is constituted of the elastic member formed of the rubber or the metal spring, similarly to the Rosen type piezoelectric transformer.

However, this proposal is effective in the Rosen type piezoelectric transformer, but cannot be applied to the laminated piezoelectric transformer having the different operation principle without modification. The reason for this is that:

In the laminated piezoelectric transformer, since the vibration node is a point, the piezoelectric transformer cannot be fixed in the housing in a stable condition highly resistive to vibration and shock, by use of the support member constituted of an elastic material such as the rubber and the metal spring. As a result, a relative positional deviation occurs between an upper supporting point and a lower supporting point, so that the piezoelectric transformer becomes inclined.

Furthermore, in the above mentioned proposed package structure for the laminated piezoelectric transformer, the heat generated for the piezoelectric vibration, which has become large particularly in a high-power piezoelectric transformer, cannot be effectively dissipated to an external. The reason for this is that:

In the laminated piezoelectric transformer, since the vibration node is a point, the heat-dissipating thin plate used in the Rosen type piezoelectric transformer cannot be used. In addition, since the piezoelectric transformer vibrates with a high frequency and with a large amplitude, a mechanically weak structure typified by the heat-dissipating thin plate is broken because of the vibration. Alternatively, the vibration of the piezoelectric transformer is transmitted to the heat-dissipating thin plate, so that noises are generated.

SUMMARY OF THE INVENTION

Accordingly, it is an object of the present invention to provide a laminated piezoelectric transformer, which has overcome the above mentioned problems of the prior art, and a method for manufacturing the same.

Another object of the present invention is to provide a laminated piezoelectric transformer, capable of firmly fixing the piezoelectric transformer in a housing and capable of effectively dissipating the generated in the piezoelectric transformer, and a method for manufacturing the same.

The above and other objects of the present invention are achieved in accordance with the present invention by a laminated piezoelectric transformer characterized in that at least one through-hole is formed to penetrate through a laminated piezoelectric body at a position which becomes a node of vibration of the laminated piezoelectric transformer, and a support rod member is inserted in the at least through-hole and fixed in the at least through-hole for supporting the laminated piezoelectric body. Thus, the piezoelectric transformer is mechanically supported by the support rod member.

According to another aspect of the present invention, there is provided a laminated piezoelectric transformer comprising a laminated piezoelectric body constituted of a plurality of piezoelectric ceramic layers and a plurality of internal planar electrodes, which are alternately stacked to form an integral laminated piezoelectric body, the plurality of piezoelectric ceramic layers being polarized in a thickness direction of the laminated piezoelectric body, at least one through-hole formed to penetrate through the laminated piezoelectric body in the thickness direction, and a support member inserted in the at least through-hole and fixed in the at least through-hole for supporting the laminated piezoelectric body. Thus, the piezoelectric transformer is mechanically supported by the support member.

In one embodiment, the at least one through-hole penetrates through the laminated piezoelectric body in a substantially center position of a layer plane of the piezoelectric ceramic layers and the internal planar electrodes, in a direction perpendicular to the layer plane.

In a preferred embodiment, the support member is in the form of a rod and is covered partially in an axial direction with conductive layers which are electrically connected to the internal planar electrodes within the at least one through-hole.

In a specific embodiment, the laminated piezoelectric body is divided in the thickness direction into a driver section and a generator section. The support member is in the form of a rod and has at least two electrically conducting regions which are separated from each other in an axial direction and which are electrically insulated from each other. One of the at least two electrically conducting regions is electrically connected to the internal planar electrodes of the driver section within the at least one through-hole. The other of the at least two electrically conducting regions is electrically connected to the internal planar electrodes of the generator section within the at least one through-hole.

According to another aspect of the present invention, there is provided a method for manufacturing a laminated piezoelectric transformer comprising a laminated piezoelectric body constituted of a plurality of piezoelectric ceramic layers and a plurality of internal planar electrodes, which are alternately stacked to form an integral laminated piezoelectric body, the plurality of piezoelectric ceramic layers being polarized in a thickness direction of the laminated piezoelectric body, the method including the steps of:

- forming one through-hole to penetrate through the laminated piezoelectric body in the thickness direction in a substantially center position of a layer plane of the piezoelectric ceramic layers and the internal planar electrodes;
- inserting into the through-hole a support member covered partially in a longitudinal direction with conductive layers; and
- bonding and electrically connecting the conductive layers of the support member to the internal planar electrodes within the through-hole by a conductive bonding agent.

The above and other objects, features and advantages of the present invention will be apparent from the following description of preferred embodiments of the invention with reference to the accompanying drawings.

DESCRIPTION OF THE PREFERRED EMBODIMENTS

Embodiments of the present invention will be described with reference to the accompanying drawings.

First Embodiment

Figure 1A:
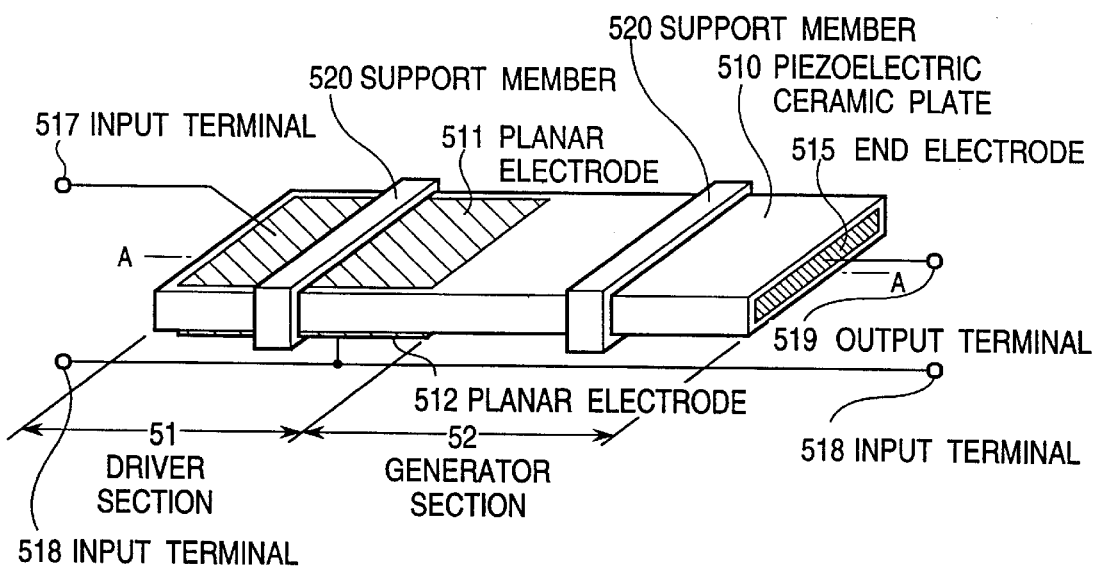
FIG. 1A is a diagrammatic perspective view illustrating a first example of the prior art Rosen type piezoelectric transformer mounted on a support member.
Figure 1B:
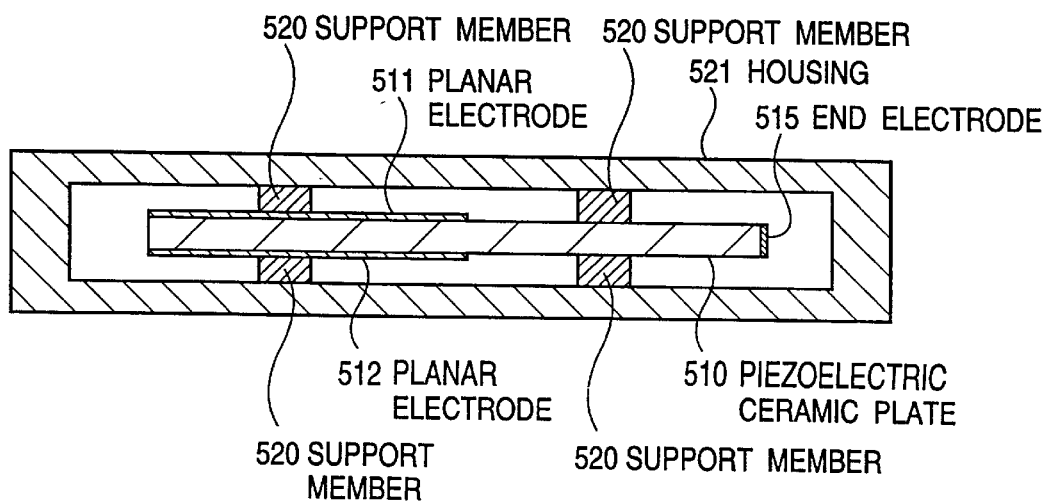
FIG. 1B is a diagrammatic sectional view taken along the line A—A in FIG. 1A but showing a condition that the piezoelectric transformer is supported within a housing.
Figure 2A:
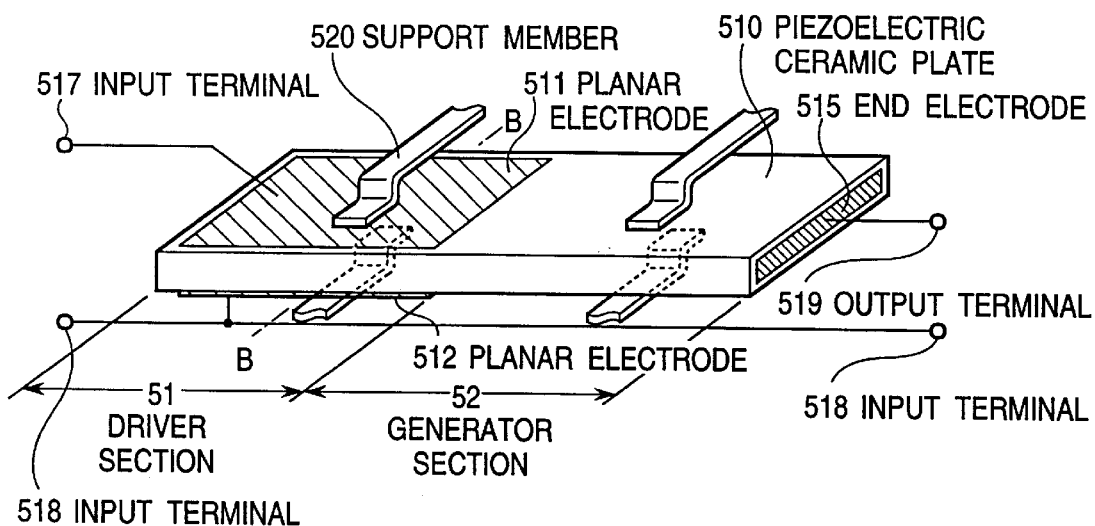
FIG. 2A is a diagrammatic perspective view illustrating a second example of the prior art Rosen type piezoelectric transformer mounted on a support member.
Figure 2B:
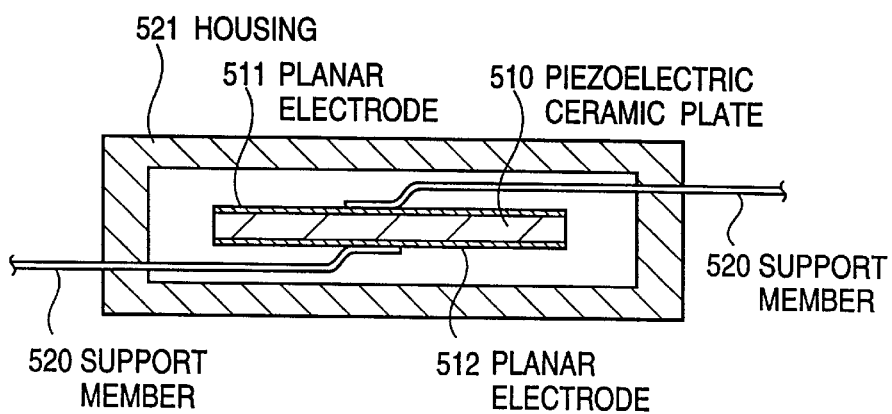
FIG. 2B is a diagrammatic sectional view taken along the line A—A in FIG. 2A but showing a condition that the piezoelectric transformer is supported within a housing.
Figure 3:
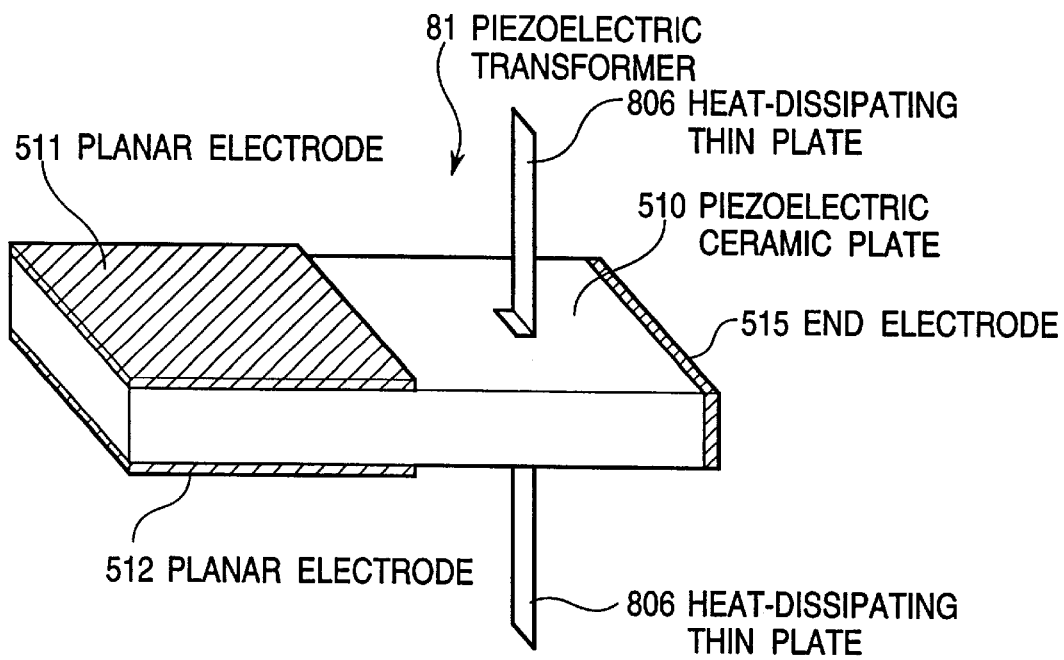
FIG. 3 is a diagrammatic perspective view illustrating a third example of the prior art Rosen type piezoelectric transformer, having a heat-dissipating plate mounted thereon for dissipating heat generated in the piezoelectric transformer.
Figure 4A:
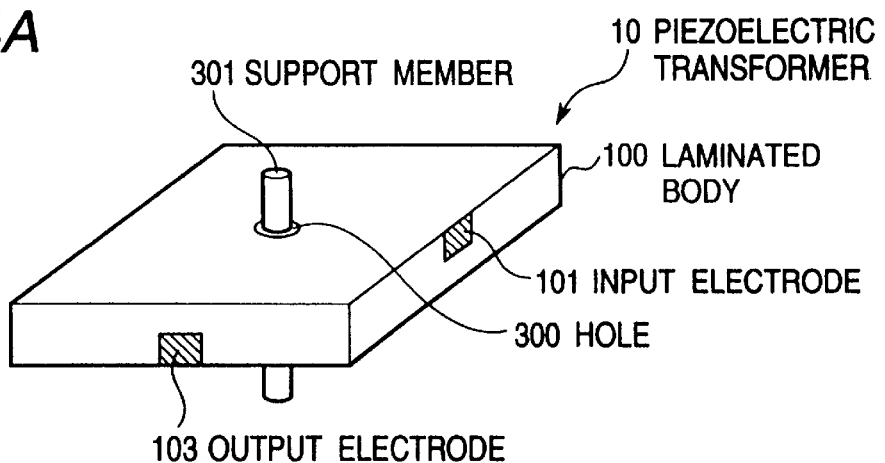
FIG. 4A is a diagrammatic perspective view illustrating a first embodiment of the laminated piezoelectric transformer in accordance with the present invention.
Figure 4B:
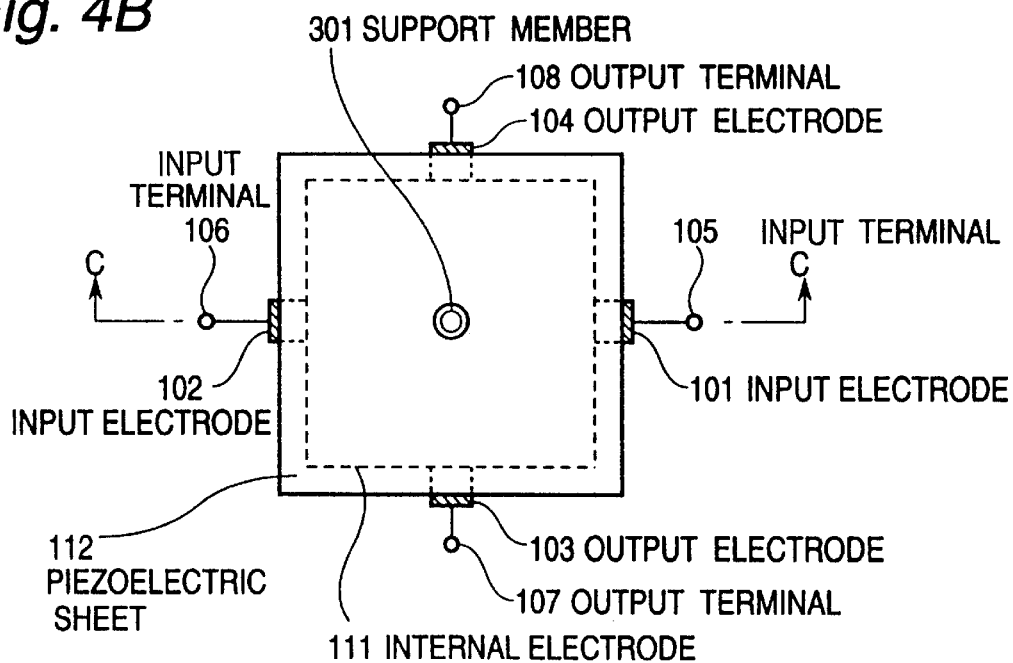
FIG. 4B is a diagrammatic plan view of the piezoelectric transformer shown in FIG. 4A.

Referring to FIG. 4A, there is shown a diagrammatic perspective view illustrating a first embodiment of the laminated piezoelectric transformer in accordance with the present invention. FIG. 4B is a diagrammatic plan view of the piezoelectric transformer shown in FIG. 4A, and FIG. 4C is a diagrammatic sectional view taken along the line C—C in FIG. 4B.

Figure 4C:
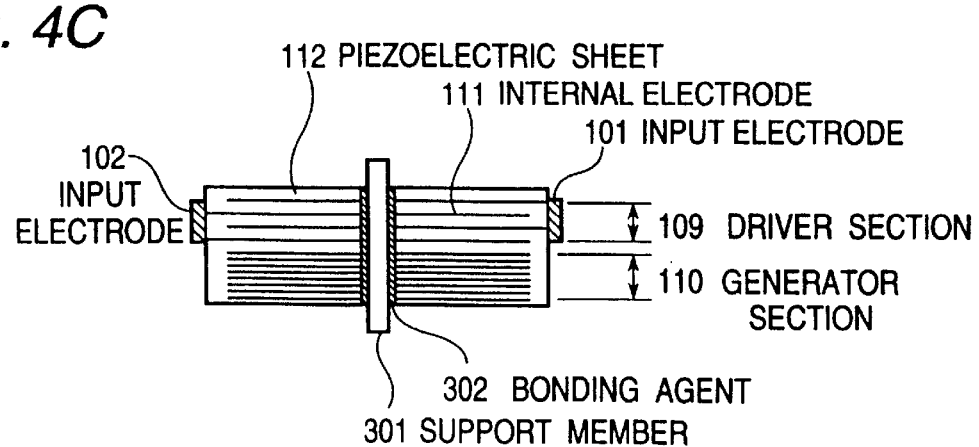
FIG. 4C is a diagrammatic sectional view taken along the line C—C in FIG. 4B.

As shown in FIGS. 4A, 4B and 4C, the laminated piezoelectric transformer is generally designated with the reference numeral 10, and includes a laminated body 100 composed by a plurality of square internal planar electrodes 111 and a plurality of square piezoelectric material sheets 112, which are alternately stacked, so that the plan shape of the piezoelectric transformer viewed from the stacking direction is square. Therefore, each of the piezoelectric material sheets 112 is polarized in a thickness direction. As shown in FIG. 4C, the laminated body 100 is divided in the thickness direction into a driver section 109 and a generator section 10.

Figure 5A:
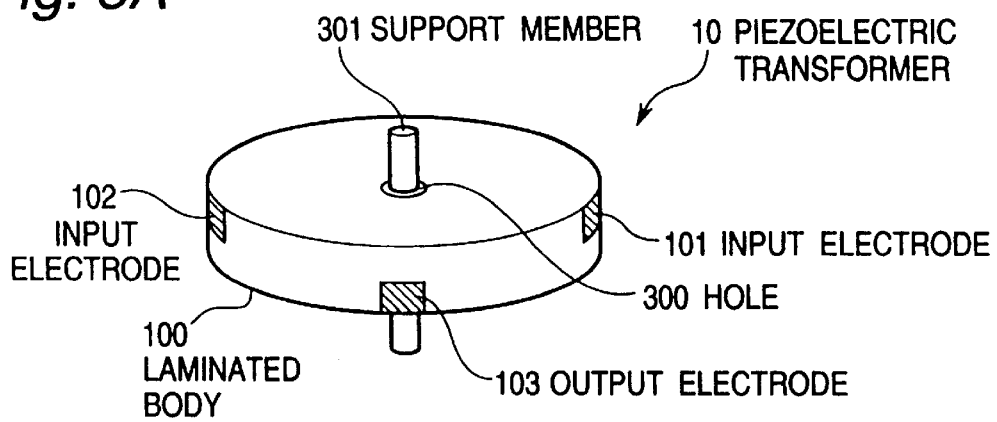
FIG. 5A is a diagrammatic perspective view illustrating a modification of the first embodiment of the laminated piezoelectric transformer in accordance with the present invention.
Figure 5B:
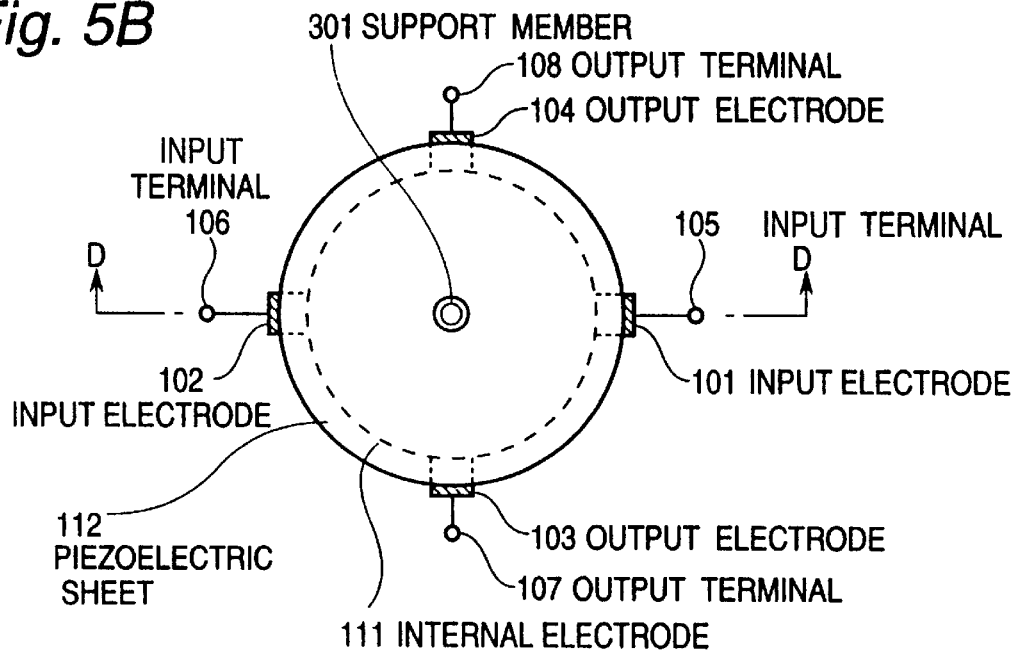
FIG. 5B is a diagrammatic plan view of the piezoelectric transformer shown in FIG. 5A.
Figure 5C:
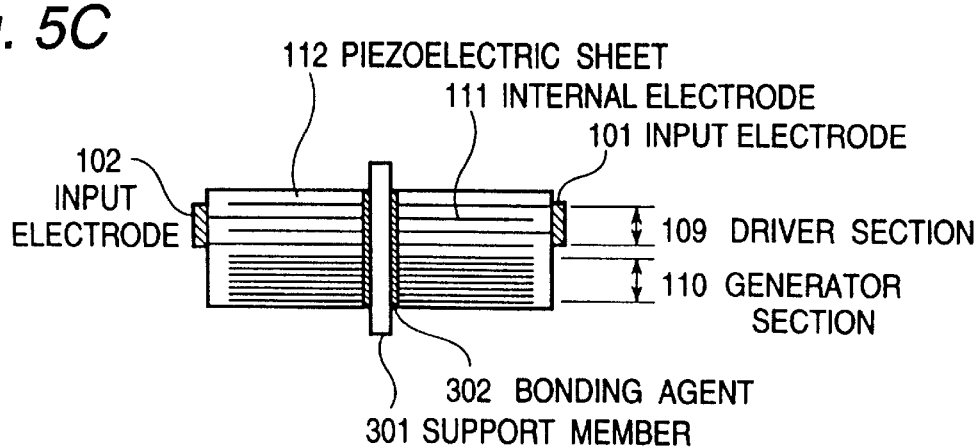
FIG. 5C is a diagrammatic sectional view taken along the line D—D in FIG. 5B.

Referring to FIG. 5A, there is shown a diagrammatic perspective view illustrating a modification of the first embodiment of the laminated piezoelectric transformer in accordance with the present invention. FIG. 5B is a diagrammatic plan view of the piezoelectric transformer shown in FIG. 5A, and FIG. 5C is a diagrammatic sectional view taken along the line D—D in FIG. 5B. In FIGS. 5A, 5B and 5C, elements corresponding to those shown in FIGS. 4A, 4B and 4C are given the same reference numerals.

As seen from comparison between FIGS. 4A, 4B and 4C and FIGS. 5A, 5B and 5C, the modification shown in FIGS. 5A, 5B and 5C is the same as the first embodiment shown in FIGS. 4A, 4B and 4C, excepting only that the plan shape of the piezoelectric transformer viewed from the stacking direction is square in the first embodiment shown in FIGS. 4A, 4B and 4C but is circular in the modification shown in FIGS. 5A, 5B and 5C. In the modification shown in FIGS. 5A, 5B and 5C, therefore, the alternately stacked piezoelectric ceramic layers and internal electrode layers are circular as the matter of course. However, since the modification is the same as the first embodiment other than the plan shape of the piezoelectric transformer, further explanation for only the modification will be omitted. On the other hand, it would be understood to persons skilled in the art that the plan shape of the piezoelectric transformer viewed from the stacking direction is in no way to only the square and the circle.

In the following, both the first embodiment shown in FIGS. 4A, 4B and 4C and the modification shown in FIGS. 5A, 5B and 5C will be described together.

In the driver section 109, a pair of input electrodes 101 and 102 are formed at a pair of opposing side surfaces of the laminated body 100, respectively, and are electrically connected to the internal planar electrodes 111 alternately in the thickness direction as shown in FIG. 4C. For example, in FIG. 4C, if the uppermost internal planar electrode 111 of the laminated body 100 is connected to the input electrode 101, the second internal planar electrode 111 counted from the uppermost internal planar electrode 111 is connected to the input electrode 102, and the third internal planar electrode 111 counted from the uppermost internal planar electrode 111 is connected to the input electrode 101, again.

In the generator section 110, a pair of output electrodes 103 and 104 are formed at another pair of opposing side surfaces of the laminated body 100, respectively, which are orthogonal to the first pair of opposing side surfaces provided with the input electrodes 101 and 102, respectively. These output electrodes 103 and 104 are electrically connected to the internal planar electrodes 111 alternately in the thickness direction. For example, although not shown in FIG. 4C, if the lowermost internal planar electrode 111 of the laminated body 100 is connected to the output electrode 103, the second internal planar electrode 111 counted from the lowermost internal planar electrode 111 is connected to the output electrode 104, and the third internal planar electrode 111 counted from the lowermost internal planar electrode 111 is connected to the output electrode 103, again.

The input electrodes 101 and 102 are electrically connected to a pair of input terminals 105 and 106, respectively, and the output electrodes 103 and 104 are electrically connected to a pair of output terminals 107 and 108, respectively.

Furthermore, a through-hole 300 is formed to penetrate through the laminated body 100 composed of the alternately stacked internal planar electrodes 111 and piezoelectric material sheets 112, at a substantially center position of a layer plane of the planar electrodes 111 and the piezoelectric material sheets 112, and in a thickness direction perpendicular to the plane of the planar electrodes 111 and the piezoelectric material sheets 112. A support member 301 in the form of a rod is inserted in the through-hole 300 and is bonded to the laminated body 100 by a bonding agent 302.

Thus, by applying an input AC voltage between the input electrodes 101 and 102 through the input terminals 105 and 106, a voltage generated between the output electrodes 103 and 104 can be obtained through the output terminals 107 and 108.

Now, a method for manufacturing the laminated piezoelectric transformer of this embodiment will be described.

The piezoelectric material sheets 112 were formed by a green sheet stacking method using a piezoelectric ceramic material which is available from Tokin Corporation, Sendai, Japan, under the tradename "NEPEC 8". The internal planar electrodes 111 were formed by using a sinter type Ag/Pd paste (for example, Ag/Pd ratio is 70/30). "NEPEC 8" is a material of a PZT type piezoelectric ceramic.

The laminated body 100 composed of the alternately stacked internal planar electrodes I 111 and piezoelectric material sheets 112, was manufactured by screen-printing the Ag/Pd paste in a predetermined pattern on each green sheet of the piezoelectric material sheet 112, stacking a plurality of piezoelectric material green sheets each having the predetermined pattern of Ag/Pd paste layer screen-printed on one surface thereof, and sintering the stacked body thus obtained, at a temperature of 1200° C. for a keeping time of two hours.

In this example, the piezoelectric material sheets 112 are formed of the PZT type piezoelectric ceramic and the internal planar electrodes 111 are formed of Ag/Pd. However, it would be a matter of course to persons skilled in the art that the materials for the piezoelectric material sheets 112 and the internal planar electrodes 111 are in no way limited to these materials, and it is possible to use any material having a piezoelectric effect and any electrode maternal, which can be sintered together to form an integral laminated body 100 composed of the alternately stacked internal planar electrodes 111 and piezoelectric material sheets 112.

In this embodiment, the driver section 109 of the laminated body 100 is formed of seven piezoelectric material sheets 112 and six internal planar electrodes 111, which are alternately stacked, and the thickness of the piezoelectric material sheets 112 between each pair of adjacent internal planar electrodes 111 is 285 μm. On the other hand, the generator section 110 of the laminated body 100 is formed of 35 piezoelectric material sheets 112 and 34 internal planar electrodes 111, which are alternately stacked, and the thickness of the piezoelectric material sheets 112 between each pair of adjacent internal planar electrodes 111 is 57 μm. However, the thickness and the number are in no way limited to these values, and can be freely determined to meet a required performance of the piezoelectric transformer.

Therefore, the sintered laminated body has a thickness of about 4 mm. Then, this laminated body was cut out into a plan size of 24 mm square. In the modification, the laminated body was cut out into a plan size of 24 mm diameter. Furthermore, the sinter type Ag/Pd paste was printed at positions of the input electrodes and the output electrodes, and then, was sintered at a temperature of 700° C. for a keeping time of 15 minutes. As a result, the input electrodes 101 and 102 and the output electrodes 103 and 104 were formed.

Thereafter, by using a polarizing instrument, an electric field on the order of 2 kV/mm to 3 kV/mm is applied to the laminated body in a silicone oil at a temperature of 100° C. to 200° C., so that the piezoelectric material sheets 112 in the driver section 109 and the generator section 110 were polarized.

Furthermore, by means of a ultrasonic machining method, a circular through-hole 300 having a diameter of about 3 mm was formed on a substantially center position of a layer plane of the laminated body 100, which becomes a node of a vibration of the piezoelectric transformer 10. Then, a circular support rod 301 having a diameter of about 1.5 mm was prepared. This support rod 301 was formed of for example a resin, metal or ceramic, which has excellent mechanical strength and workability and a high heat conductivity. After an outer surface of the support rod 301 is coated with an insulating silicon bonding agent 302 (having the post-hardening hardness of for example 30 to 50 in JIS hardness), the support rod 301 was inserted into the through-hole 300, and then, the bonding agent was hardened at a temperature of 170° C. for a keeping time of 15 minutes. In this case, since the bonding agent 302 is electrically insulative, the internal planar electrodes 111 of the laminated body 100 are maintained in a mutually insulated condition within the through-hole 300. In addition, the support rod 301 can be formed of metal as mentioned above.

The input terminals 105 and 106 and the output terminals 107 and 108 were soldered to the input electrodes 101 and 102 and the output electrodes 103 and 104 of the laminated piezoelectric transformer thus obtained, respectively. Thereafter, a load of 10 Ω was connected between the output terminals 107 and 108, and a voltage having a driving frequency of 70 kHz was applied between the input terminals 105 and 106, so that the laminated piezoelectric transformer is driven in a first mode of a diameter direction resonation in FIG. 5B, and the characteristics was evaluated. At the output power of 20 W, the energy conversion efficiency was 98%, and the transformation ratio was 0.25.

As a comparative example, there was formed a laminated piezoelectric transformer having no support member 301 but formed with the terminals. In this comparative example, at the output power of 30 W, the energy conversion efficiency dropped (90% to 92%) because of a heat generation, and at the output power of 40 W, in some samples, the terminals were dropped from the laminated piezoelectric transformer at the soldering portion because of the heat generation. In this embodiment, however, although the output power was elevated to 30 W to 40 W, the energy conversion efficiency did not drop almost. This is because the piezoelectric transformer is supported by the support member 301 and the heat generated in the piezoelectric transformer is effectively dissipated through the support member 301.

In the above mentioned embodiment, the diameter of the hole 300 is 3 mm and the diameter of the support member 301 is 1.5 mm. However, these sizes are in no way limited to these values, but can be freely determined if the piezoelectric transformer can be held to a satisfactory extent.

Second Embodiment

Figure 6A:
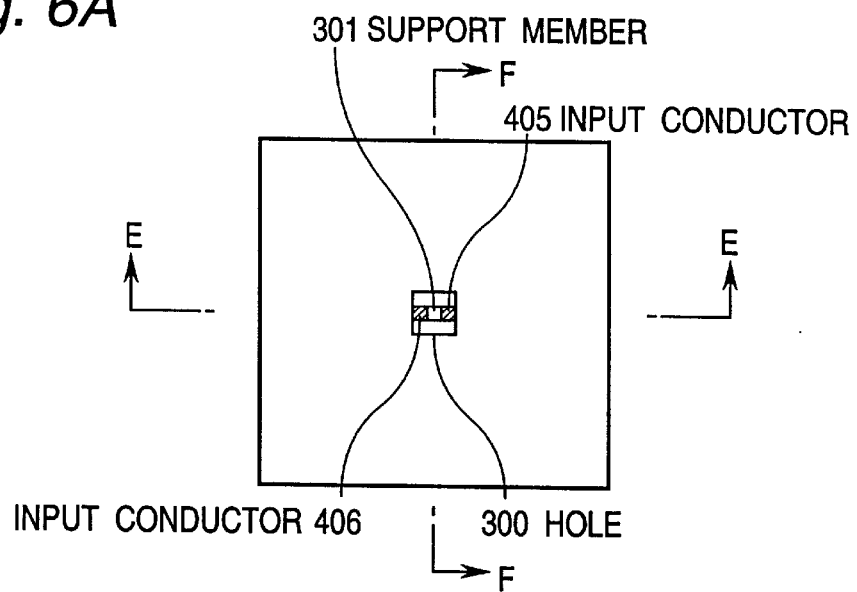
FIG. 6A is a diagrammatic plan view illustrating a second embodiment of the laminated piezoelectric transformer in accordance with the present invention.
Figure 6B:
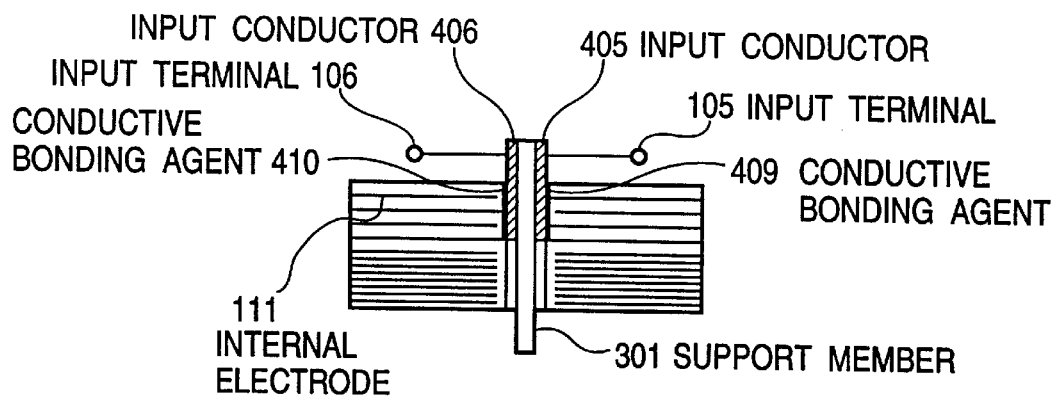
FIG. 6B is a diagrammatic sectional view taken along the line E—E in FIG. 6A.
Figure 6C:
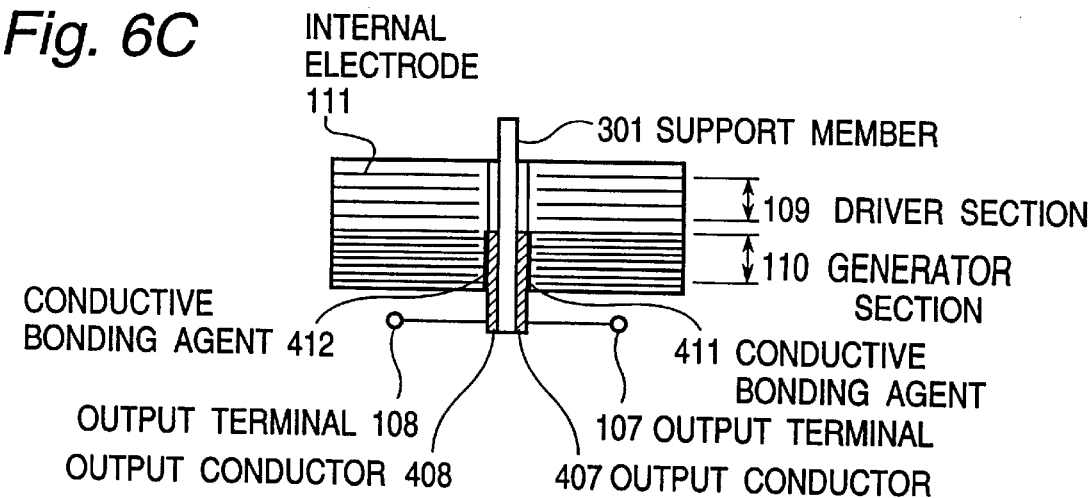
FIG. 6C is a diagrammatic sectional view taken along the line F—F in FIG. 6A.

Referring to FIG. 6A, there is shown a diagrammatic perspective view illustrating a second embodiment of the laminated piezoelectric transformer in accordance with the present invention. FIG. 6B is a diagrammatic sectional view taken along the line E—E in FIG. 6A, and FIG. 6C is a diagrammatic sectional view taken along the line F—F in FIG. 6A.

The second embodiment is featured in that an input/output terminal function is added to the support member of the first embodiment of the laminated piezoelectric transformer.

Now, this second embodiment will be described with reference to FIGS. 6A, 6B and 6C. Similarly to the first embodiment, the sintered laminated body having a thickness of about 4 mm and cut out into a plan size of 24 mm square was prepared. Thereafter, a square through-hole 300 having a size of 3 mm square was formed on a substantially center position of a layer plane of the laminated body 100, which becomes a node of a vibration of the piezoelectric transformer 10.

In addition, as the support member to be inserted into the through-hole, a square insulating rod partially coated with a conducting film such as a metal film is prepared. This square insulating rod has excellent mechanical strength and workability and a high heat conductivity, similarly to the first embodiment. For example, a square insulating rod 301 having a size of 1 mm square was formed. As shown in FIG. 6B, in an upper portion of the square insulating rod 301, which is positioned in the driver section 109 when the rod 301 is inserted in the through-hole 300, a pair of input conductors 405 and 406 are coated on a pair of opposing side surfaces of the square insulating rod 301. As shown in FIG. 6C, in a lower upper portion of the square insulating rod 301, which is positioned in the generator section 110 when the rod 301 is inserted in the through-hole 300, a pair of output conductors 407 and 408 are coated on another pair of opposing side surfaces of the square insulating rod 301, which are orthogonal to the pair of opposing side surfaces of the square insulating rod 301 provided with the pair of input conductors 405 and 406.

Furthermore, conductive bonding agent layers 409 and 410 were applied on the input conductors 405 and 406, respectively, and conductive bonding agent layers 411 and 412 were applied on the output conductors 407 and 408, respectively. Here, a conductive silicon bonding agent having the post-hardening hardness of for example 30 to 50 in JIS hardness similarly to the first embodiment, is preferred. After the supporting rod 301 was inserted in the through-hole 300, the conductive bonding agent was hardened at a temperature of 170° C. for a keeping time of 15 minutes.

Thus, in the driver section 109, the pair of input conductors 405 and 406 are electrically connected to the internal planar electrodes 111 within the through-hole 300 alternately in the thickness direction as shown in FIG. 6B. For example, in FIG. 6B, if the uppermost internal planar electrode 111 of the laminated body 100 is connected to the input conductor 405, the second internal planar electrode 111 counted from the uppermost internal planar electrode 111 is connected to the input conductor 406, and the third internal planar electrode 111 counted from the uppermost internal planar electrode 111 is connected to the input conductor 405, again.

In the generator section 110, the pair of output conductors 407 and 408 are electrically connected to the internal planar electrodes 111 within the through-hole 300 alternately in the thickness direction as shown in FIG. 6C. For example, in FIG. 6C, if the lowermost internal planar electrode 111 of the laminated body is connected to the output conductors 408, the second internal planar electrode 111 counted from the lowermost internal planar electrode 111 is connected to the output conductors 407, and the third internal planar electrode 111 counted from the lowermost internal planar electrode 111 is connected to the output conductors 408, again.

Furthermore, the pair of input conductors 405 and 406 are electrically connected to the pair of input terminals 105 and 106, respectively, and the pair of output conductors 407 and 408 are electrically connected to the pair of output terminals 107 and 108. Thus, the rod 301 functions as the support member and as an electrode assembly.

In this second embodiment thus obtained, since the circumference of the support member 301 is covered with the electrically conductive material layer, which is preferably formed of a metal having an excellent heat conductivity, the support member 301 itself has the heat conductivity more excellent than that of the support member 301 in the first embodiment. Furthermore, since the bonding agent for bonding the support member to the through-hole includes metal powders for increasing the electric conductivity, the conductive bonding agent has an elevated heat conductivity. Therefore, the second embodiment can transfer and dissipate the heat more effectively than the first embodiment.

After the laminated piezoelectric transformer thus obtained was polarized similarly to the first embodiment, a load of 10 Ω was connected and a voltage was applied in order to evaluate the characteristics. At the output power of 20 W, the energy conversion efficiency was 98%, and the transformation ratio was 0.25. In addition, although the output power was elevated to 30 W to 40 W, the energy conversion efficiency did not drop almost. Namely, an excellent result was obtained.

In the second embodiment shown in FIGS. 6A, 6B and 6C, the pair of input conductors 405 and 406 are formed on a pair of opposing side surfaces of the square insulating rod 301, and the pair of output conductors 407 and 408 are formed on another pair of opposing side surfaces of the square insulating rod 301, which are orthogonal to the pair of opposing side surfaces of the square insulating rod 301 provided with the pair of input conductors 405 and 406.

Figure 7A:
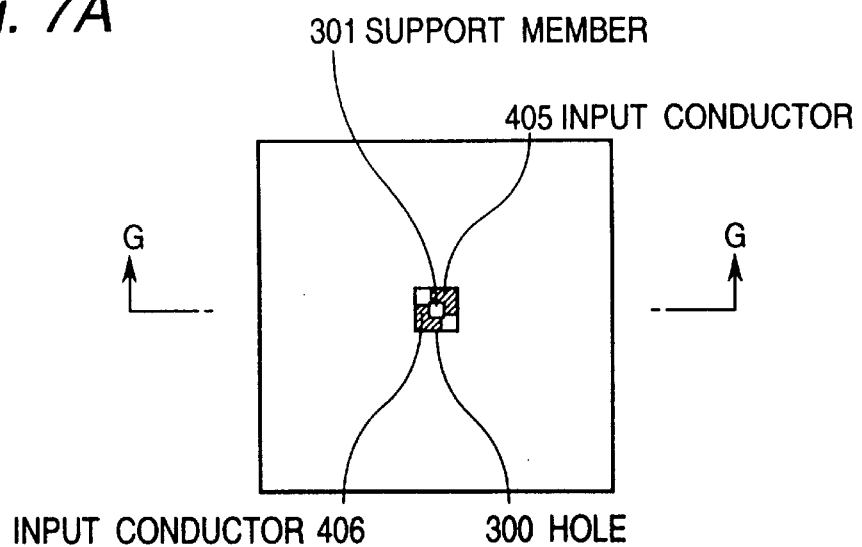
FIG. 7A is a diagrammatic plan view illustrating a modification of the second embodiment of the laminated piezoelectric transformer in accordance with the present invention.
Figure 7B:
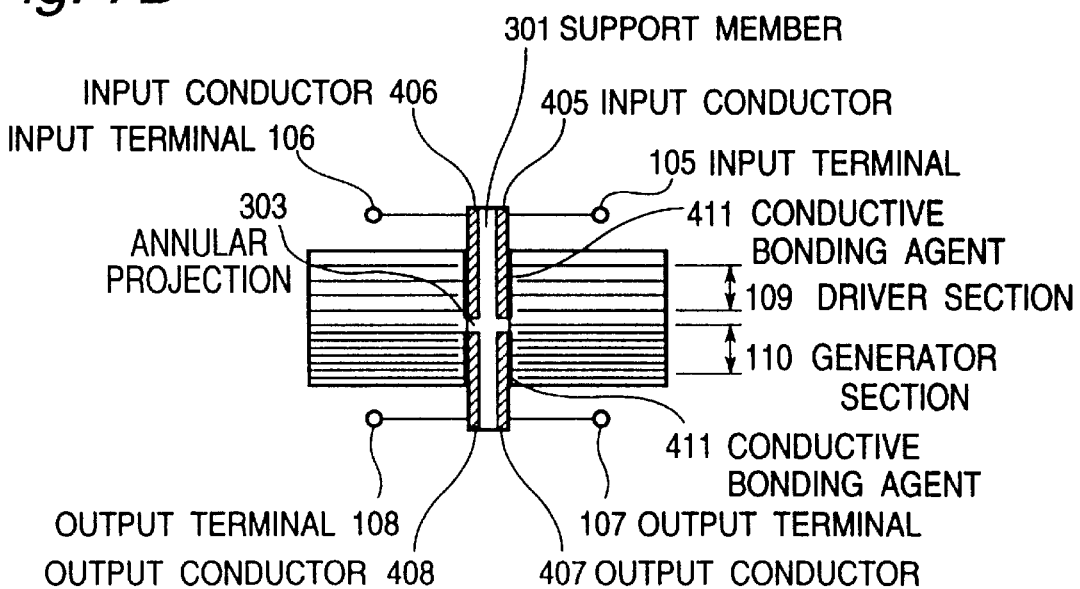
FIG. 7B is a diagrammatic sectional view taken along the line G—G in FIG. 7A.

Referring to FIG. 7A is shown a diagrammatic plan view illustrating a modification of the second embodiment of the laminated piezoelectric transformer in accordance with the present invention. FIG. 7B is a diagrammatic sectional view taken along the line G—G in FIG. 7A.

In the modification shown in FIGS. 7A and 7B, in an upper portion of the square insulating rod 301, which is positioned in the driver section 109 when the rod 301 is inserted in the through-hole 300, a first input conductor 405 is formed to substantially cover a first pair of adjacent side surfaces of the square insulating rod 301 and a corner between the first pair of adjacent side surfaces, and a second input conductor 406 is formed to substantially cover a second pair of adjacent side surfaces opposing to the first pair of adjacent side surfaces and a corner between the second pair of adjacent side surfaces. However, in order to short-circuit between the first input conductor 405 and the second input conductor 406, the remaining opposing corners of the square insulating rod 301 are covered with neither the first input conductor 405 nor the second input conductor 406.

Furthermore, in a lower upper portion of the square insulating rod 301, which is positioned in the generator section 110 when the rod 301 is inserted in the through-hole 300, a first output conductor 407 is formed to substantially cover a first pair of adjacent side surfaces of the square insulating rod 301 and a corner between the first pair of adjacent side surfaces, and a second output conductor 408 is formed to substantially cover a second pair of adjacent side surfaces opposing to the first pair of adjacent side surfaces and a corner between the second pair of adjacent side surfaces. However, in order to short-circuit between the first output conductor 407 and the second output conductor 408, the remaining opposing corners of the square insulating rod 301 are covered with neither the first output conductor 407 nor the second output conductor 408.

In order to prevent the short-circuiting between the pair of input conductors 405 and 406 and the pair of output conductors 407 and 408, the pair of input conductors 405 and 406 and the pair of output conductors 407 and 408 are formed to be separated from each other in an axial direction of the square insulating rod 301 at a boundary region between the driver section 109 and the generator section 110. In this connection, in order to surely prevent the short-circuiting between the pair of input conductors 405 and 406 and the pair of output conductors 407 and 408, an annular projection 303 can be provided at an intermediate position of the square insulating rod 301 in the axial direction, as shown in FIG. 7B, which positionally corresponds to the boundary region between the driver section 109 and the generator section 110.

If the structure of the second embodiment is adopted in the laminated piezoelectric transformer having for example a first-order vibration mode, since an electrical connection is attained at a larger surface area of the support member 301 for supporting the piezoelectric transformer, the second embodiment is more advantageous than the first embodiment particularly when a large current is caused to flow. The reason for this is that: In the first-order or odd-number-order vibration mode, since an antinode of the vibration is positioned at the side surface of the laminated piezoelectric body, the size of the electrodes 101, 102, 103 and 104 formed on the side surface of the laminated piezoelectric body cannot be enlarged, because the large electrodes disturb the vibration. In addition, in the modification shown in FIGS. 7A and 7B, since the support member 301 is bonded to an inner surface of the square through-hole 300 through the input or output conductors at a larger surface area of the support member 301 in comparison with the second embodiment shown in FIGS. 6A, 6B and 6C, the modification shown in FIGS. 7A and 7B can have the heat transfer efficiency higher than that realized in the second embodiment shown in FIGS. 6A, 6B and 6C.

In the above mentioned first and second embodiments, the plan shape of the laminated body viewed in the stacking direction is square or circular, but is in no way limited to these shapes, as mentioned hereinbefore. For example, the plan shape of the laminated body viewed in the stacking direction can be an ellipse or a rectangle other than the square.

Furthermore, in the above mentioned first and second embodiments, only one through-hole penetrating through the laminated body is formed at the substantially center position in a layer plane, which becomes a node of the vibration of the piezoelectric transformer. In the present invention, however, the number of the through-hole is not limited to only one. When a plurality of vibration nodes are generated in the layer plane, it is possible to form a plurality of through-holes penetrating through the laminated body.

The piezoelectric transformer mentioned above in accordance with the present invention has the following advantages.

A first advantage is that the piezoelectric transformer is surely and easily supported by the support member inserted in the position which becomes the vibration node, within the layer plane of the laminated body. The reason for this is that, since there is adopted the novel structure that the support member is inserted in the hole formed at the position which becomes the vibration node of the laminated piezoelectric transformer, it is possible to fix the laminated body to the support member, without disturbing the vibration caused by the piezoelectric effect, in a mounting structure highly resistive to vibration and shock, and without a troublesome handling for positioning.

A second advantage is that it is possible to effectively dissipate the heat generated in the piezoelectric transformer. The reason for this is that, since the laminated body and the support member is mechanically connected to each other through a bonding agent having an excellent heat conductivity, the heat generated in the piezoelectric transformer can be effectively transferred to an external through the support member, with no necessity of providing a special mechanism for the heat dissipation. In addition, by forming the electrically conducting layer on the surface of the support member, the heat conductivity of the support member can be further elevated.

A third advantage is that it is possible to provide the piezoelectric transformer, which can easily and surely lead out the electrode to an external, which can be easily assembled and which can inexpensively realize a high-power. The reason for this is that, if the conducting layer is formed on the surface of the support member inserted in the through-hole penetrating through the laminated body at the position of the vibration node of the laminated body, and is electrically connected through the conducting bonding agent to the internal electrodes formed in the laminated body, it is possible to connect the piezoelectric transformer to an external, with no necessity of forming the electrodes independently of the support member for the piezoelectric transformer. In this case, a large contact area can be ensured, and in addition, it is possible to minimize the impedance in the connection portion.

The invention has thus been shown and described with reference to the specific embodiments. However, it should be noted that the present invention is in no way limited to the details of the illustrated structures but changes and modifications may be made within the scope of the appended claims.

What is claimed is:

1. A laminated piezoelectric transformer comprising:
   (a) a laminated piezoelectric body which includes a plurality of piezoelectric ceramic layers and a plurality of internal planar electrodes, which are alternately stacked to form an integral laminated piezoelectric body, said plurality of piezoelectric ceramic layers being polarized in a thickness direction of said laminated piezoelectric body, so that a vibration node becomes a point in a plane perpendicular to said thickness direction of said laminated piezoelectric body, and wherein said laminated piezoelectric body is divided into a driver section and a generator section stacked in said thickness direction;
   (b) at least one through-hole formed to penetrate through said laminated piezoelectric body in said thickness direction, at a position which becomes a vibration node of the laminated piezoelectric transformer and in a substantially center position of a layer plane of said piezoelectric ceramic layers and said internal planar electrodes, in a direction perpendicular to said layer plane; and
   (c) a heat-conductive, electrically-insulative support rod member inserted in said at least one through-hole, wherein said support rod member is covered partially in an axial direction with conductive layers which are electrically connected to said internal planar electrodes within said at least one through-hole.

2. A laminated piezoelectric transformer comprising:
   (a) a laminated piezoelectric body which includes a plurality of piezoelectric ceramic layers and a plurality of internal planar electrodes, which are alternately stacked to form an integral laminated piezoelectric body, said plurality of piezoelectric ceramic layers being polarized in a thickness direction of said laminated piezoelectric body, so that a vibration node becomes a point in a plane perpendicular to said thickness direction of said laminated piezoelectric body, and wherein said laminated piezoelectric body is divided into a driver section and a generator section stacked in said thickness direction;
   (b) at least one through-hole formed to penetrate through said laminated piezoelectric body in said thickness direction, at a position which becomes a vibration node of the laminated piezoelectric transformer and in a substantially center position of a layer plane of said piezoelectric ceramic layers and said internal planar electrodes, in a direction perpendicular to said layer plane; and
   (c) a heat-conductive, electrically-insulative support rod member inserted in said at least one through-hole, wherein said support rod member has at least two electrically conducting regions which are separated from each other in an axial direction and which are electrically insulated from each other, one of said at least two electrically conducting regions being electrically connected to said internal planar electrodes of said driver section within said at least one through-hole, and the other of said at least two electrically conducting regions being electrically connected to said internal planar electrodes of said generator section within said at least one through-hole.

3. A laminated piezoelectric transformer comprising:
   (a) a laminated piezoelectric body which includes a plurality of piezoelectric ceramic layers and a plurality of internal planar electrodes, which are alternately stacked to form an integral laminated piezoelectric body, said plurality of piezoelectric ceramic layers being polarized in a thickness direction of said laminated piezoelectric body, so that a vibration node becomes a point in a plane perpendicular to said thickness direction of said laminated piezoelectric body, and wherein said laminated piezoelectric body is divided into a driver section and a generator section stacked in said thickness direction;
   (b) at least one through-hole formed to penetrate through said laminated piezoelectric body in said thickness direction, at a position which becomes a vibration node of the laminated piezoelectric transformer; and
   (c) a heat-conductive, electrically-insulative support rod member inserted in said at least one through-hole, wherein said support rod member is covered partially in an axial direction with conductive layers which are electrically connected to said internal planar electrodes within said at least one through-hole.

4. A laminated piezoelectric transformer comprising:
   (a) a laminated piezoelectric body which includes a plurality of piezoelectric ceramic layers and a plurality of internal planar electrodes, which are alternately stacked to form an integral laminated piezoelectric body, said plurality of piezoelectric ceramic layers being polarized in a thickness direction of said laminated piezoelectric body, so that a vibration node becomes a point in a plane perpendicular to said thickness direction of said laminated piezoelectric body, and wherein said laminated piezoelectric body is divided into a driver section and a generator section stacked in said thickness direction;
   (b) at least one through-hole formed to penetrate through said laminated piezoelectric body in said thickness direction, at a position which becomes a vibration node of the laminated piezoelectric transformer; and
   (c) a heat-conductive, electrically-insulative support rod member inserted in said at least one through-hole, wherein said support rod member has at least two electrically conducting regions which are separated from each other in an axial direction and which are electrically insulated from each other, one of said at least two electrically conducting regions being electrically connected to said internal planar electrodes of said driver section within said at least one through-hole, and the other of said at least two electrically conducting regions being electrically connected to said internal planar electrodes of said generator section within said at least one through-hole.

5. A laminated piezoelectric transformer claimed in claim 1, wherein each of said driver section and said generator section includes a plurality of piezoelectric ceramic sheets, and wherein said plurality of piezoelectric ceramic sheets included in said driver section have a same thickness and said plurality of piezoelectric ceramic sheets included in said generator section have a same thickness, the thickness of said piezoelectric ceramic sheets included in said driver section being different from the thickness of said piezoelectric ceramic sheets included in said generator section.

6. A laminated piezoelectric transformer claimed in claim 2, wherein each of said driver section and said generator section includes a plurality of piezoelectric ceramic sheets, and wherein said plurality of piezoelectric ceramic sheets included in said driver section have a same thickness and said plurality of piezoelectric ceramic sheets included in said generator section have a same thickness, the thickness of said piezoelectric ceramic sheets included in said driver section being different from the thickness of said piezoelectric ceramic sheets included in said generator section.

7. A laminated piezoelectric transformer claimed in claim 3, wherein each of said driver section and said generator section includes a plurality of piezoelectric ceramic sheets, and wherein said plurality of piezoelectric ceramic sheets included in said driver section have a same thickness and said plurality of piezoelectric ceramic sheets included in said generator section have a same thickness, the thickness of said piezoelectric ceramic sheets included in said driver section being different from the thickness of said piezoelectric ceramic sheets included in said generator section.

8. A laminated piezoelectric transformer claimed in claim 4 wherein each of said driver section and said generator section includes a plurality of piezoelectric ceramic sheets, and wherein said plurality of piezoelectric ceramic sheets included in said driver section have a same thickness and said plurality of piezoelectric ceramic sheets included in said generator section have a same thickness, the thickness of said piezoelectric ceramic sheets included in said driver section being different from the thickness of said piezoelectric ceramic sheets included in said generator section.

* * * * *